United States Patent
Morinaga et al.

(10) Patent No.: US 10,920,104 B2
(45) Date of Patent: Feb. 16, 2021

(54) ABRASIVE, POLISHING COMPOSITION, AND POLISHING METHOD

(71) Applicant: FUJIMI INCORPORATED, Kiyosu (JP)

(72) Inventors: Hitoshi Morinaga, Aichi (JP); Kazusei Tamai, Aichi (JP); Maiko Asai, Aichi (JP); Yuuichi Ito, Aichi (JP); Kyosuke Tenko, Aichi (JP); Toru Kamada, Aichi (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/096,290

(22) PCT Filed: Jan. 27, 2017

(86) PCT No.: PCT/JP2017/003017
§ 371 (c)(1),
(2) Date: Oct. 25, 2018

(87) PCT Pub. No.: WO2017/187689
PCT Pub. Date: Nov. 2, 2017

(65) Prior Publication Data
US 2019/0153263 A1 May 23, 2019

(30) Foreign Application Priority Data

Apr. 26, 2016 (JP) .............................. JP2016-088332
Aug. 2, 2016 (JP) .............................. JP2016-152270

(51) Int. Cl.
| | |
|---|---|
| *C09G 1/02* | (2006.01) |
| *C09K 3/14* | (2006.01) |
| *B24B 37/00* | (2012.01) |
| *B24B 37/04* | (2012.01) |
| *H01L 21/321* | (2006.01) |
| *H01L 21/306* | (2006.01) |

(52) U.S. Cl.
CPC ................ *C09G 1/02* (2013.01); *B24B 37/00* (2013.01); *B24B 37/044* (2013.01); *C09K 3/14* (2013.01); *C09K 3/1409* (2013.01); *C09K 3/1454* (2013.01); *C09K 3/1463* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | |
|---|---|---|
| 5,300,130 A | 4/1994 | Rostoker |
| 5,665,127 A | 9/1997 | Moltgen et al. |
| 6,123,603 A | 9/2000 | Tada et al. |
| 2009/0111359 A1 | 4/2009 | Suzuki et al. |

FOREIGN PATENT DOCUMENTS

| | | | | |
|---|---|---|---|---|
| JP | 01-246068 A | 10/1989 | | |
| JP | H07-52030 A | 2/1995 | | |
| JP | H07-179848 A | 7/1995 | | |
| JP | H08-002913 | 1/1996 | | |
| JP | H08-277159 A | 10/1996 | | |
| JP | S63-288909 A | 11/1998 | | |
| JP | H11-010492 A | 1/1999 | | |
| JP | 2008-044078 A | 2/2008 | | |
| JP | 2008-163154 A | 7/2008 | | |
| JP | 2008-231159 A | 10/2008 | | |
| JP | 2008231159 | * 10/2008 | ............. | B24B 37/00 |
| JP | 2008-296318 A | 12/2008 | | |
| JP | 2009-163810 A | 7/2009 | | |
| JP | 2009-176397 A | 8/2009 | | |
| JP | 2015-120816 A | 7/2015 | | |
| WO | WO 2015-170743 A1 | 11/2015 | | |
| WO | WO 2016-043088 A1 | 8/2017 | | |
| WO | WO 2016-043089 A1 | 8/2017 | | |

* cited by examiner

*Primary Examiner* — Jiong-Ping Lu
(74) *Attorney, Agent, or Firm* — Foley & Lardner LLP

(57) ABSTRACT

Provided are an abrasive, a polishing composition, and a polishing method capable of polishing the surface of an alloy or metal oxide at a sufficient polishing removal rate and providing a high-quality mirror surface. The abrasive contains alumina having an α-conversion rate of 80% or more and having a 50% particle diameter, in a volume-based cumulative particle diameter distribution, of 0.15 μm or more to 0.35 μm or less. The polishing composition contains this abrasive and has a pH of 7 or less. These abrasive and polishing composition are used for polishing polishing objects containing at least one of an alloy and a metal oxide.

17 Claims, No Drawings

ABRASIVE, POLISHING COMPOSITION, AND POLISHING METHOD

CROSS-REFERENCE TO RELATED APPLICATIONS

This application is a National Phase of International Patent Application No. PCT/JP2017/003017, filed Jan. 27, 2017, which claims priority to Japanese Patent Application No. 2016-088332, filed Apr. 26, 2016 and Japanese Patent Application No. 2016-152270, filed Aug. 2, 2016. The contents of these applications are herein incorporated by reference in their entirety.

TECHNICAL FIELD

The present invention relates to an abrasive, a polishing composition, and a polishing method.

BACKGROUND ART

The surface of an alloy, its anodized film, or ceramics has conventionally been polished to have a mirror finish or smoothness. By the conventional polishing method, however, a higher-quality mirror surface cannot always be obtained efficiently.

For example, since an alloy has a mixture of an element serving as a main component and another element different in hardness, the alloy sometimes has, on the surface after polishing, various defects such as protrusions, dents, and scratches. It is therefore difficult to polish an alloy and achieve high-level mirror finish (refer to PTLs 1 and 2).

When finish polishing of an anodized film is performed with a conventional polishing composition using colloidal silica as abrasives, a sufficient polishing removal rate cannot always be attained (refer to PTL 3).

Further, a polishing composition containing diamond abrasives has conventionally been used for polishing the surface of a hard and brittle material such as a metal oxide to give a mirror finish or smoothness to the surface. The polishing composition containing diamond abrasives however has such problems that it is expensive and moreover, it has difficulty in providing a high-quality mirror surface because it forms scratches easily. The conventional polishing composition using colloidal silica as abrasives does not form scratches but its polishing removal rate is sometimes not adequate (refer to PTLs 4 and 5).

CITATION LIST

Patent Literatures

PTL 1: JP 1-246068 A
PTL 2: JP 11-010492 A
PTL 3: JP 7-52030 A
PTL 4: JP 7-179848 A
PTL 5: JP 2008-44078

SUMMARY OF INVENTION

Technical Problem

An object of the invention is therefore to overcome the above-described problems of the conventional art and to provide an abrasive, a polishing composition, and a polishing method capable of polishing the surface of an alloy or a metal oxide at a sufficient polishing removal rate and capable of polishing the surface into a high-quality mirror surface.

Solution to Problem

With a view to overcoming the above-described problem, an abrasive according to one aspect of the present invention is used for polishing of a polishing object containing at least one of an alloy and a metal oxide and contains alumina having an α-conversion rate of 80% or more and at the same time, having a 50% particle diameter, in a volume-based cumulative particle diameter distribution, of 0.15 μm or more to 0.35 μm or less.

A polishing composition according to another aspect of the present invention contains the abrasive described in the above embodiment and has a pH of 7 or less.

A polishing method according to a further aspect of the present invention includes polishing, with the polishing composition described in the above another embodiment, a polishing object containing at least one of an alloy and a metal oxide.

Advantageous Effects of Invention

According to the present invention, the surface of an alloy or a metal oxide can be polished at an adequate polishing removal rate and the surface thus obtained can have a high-quality mirror surface.

DESCRIPTION OF EMBODIMENTS

One embodiment of the present invention will be described in detail. The following embodiment is only one example of the present invention and the present invention is not limited to or by the embodiment. The following embodiment can be modified or improved in various ways and such modification or improvement is also embraced in the present invention.

The abrasive of the present embodiment is used for polishing of a polishing object containing at least one of an alloy and a metal oxide and contains alumina having an α-conversion rate of 80% or more and has a 50% particle diameter, in a volume-based cumulative particle diameter distribution, of 0.15 μm or more to 0.35 μm or less. The polishing composition of the present embodiment contains the abrasive of the present embodiment and has a pH of 7 or less Such an abrasive and polishing composition according to the present embodiment can be used for polishing of polishing objects each containing at least one of an alloy and a metal oxide. By polishing, with the abrasive or polishing composition according to the present embodiment, polishing objects, the surface of the alloy or metal oxide can be polished at a sufficient polishing removal rate and a high-quality mirror surface can be obtained. Described specifically, by polishing the polishing objects with the abrasive or the polishing composition according to the present embodiment, the surface of the polishing objects each containing at least one of an alloy and a metal oxide can be polished at a sufficient polishing removal rate and at the same time, the polishing objects can have a more smooth surface and therefore have a high-gloss and high-quality mirror surface with less defects such as scratches.

The abrasive and polishing composition according to the present embodiment will hereinafter be described in detail. Various operations and measurement of physical properties described later were performed under the conditions of a room temperature (20° C. or more to 25° C. or less) and a relative humidity of 40% or more to 50% or less unless otherwise particularly indicated.

1. Polishing Objects 1-1. Alloy

The abrasive and polishing composition according to the present embodiment can be used for polishing of alloy-containing polishing objects. The alloy contains a metal species serving as a main component and another metal species different from the metal species serving as a main component. The number of the metal species is not particularly limited and it may be two, three, or more. A method of producing an alloy is not particularly limited and for example, casting, forging, or rolling can be used.

Of the metal species contained in the alloy, the metal species serving as a main component is preferably any one selected from the group consisting of aluminum, titanium, magnesium, iron, nickel, and copper. An alloy having aluminum, titanium, magnesium, or iron as the main component metal species is more preferred, with the alloy having aluminum or iron as the main component metal species being more preferred. The alloy is named based on the main component metal species. Examples of the alloy therefore include an aluminum alloy, a titanium alloy, a magnesium alloy, an iron alloy (for example, a stainless steel), a nickel alloy, and a copper alloy.

The aluminum alloy has aluminum as a main component and further contains, as another metal species different from the main component metal species, at least one metal selected from, for example, silicon, iron, copper, manganese, magnesium, zinc, and chromium. The content of the metal species other than aluminum in the aluminum alloy is, for example, 0.1 mass % or more, more specifically, 0.1 mass % or more to 10 mass % or less. Examples of the aluminum alloy include Alloy Number 2000 series, 3000 series, 4000 series, 5000 series, 6000 series, 7000 series, and 8000 series aluminum alloys described in the Japanese Industrial Standards (JIS) H4000:2006, JIS H4040:2006, and JIS H4100:2006.

The titanium alloy has titanium as a main component and further contains, as another metal species different from the main component metal species, at least one metal selected from, for example, aluminum, iron, and vanadium. The content of the metal species other than titanium in the titanium alloy is, for example, 3.5 mass % or more to 30 mass % or less. Examples of the titanium alloy include Class 11 to Class 23, Class 50, Class 60, Class 61, and Class 80 in the class described in the Japanese Industrial Standards (JIS) H4600:2012.

The magnesium alloy has magnesium as a main component and further contains, as another metal species different from the main component metal species, at least one metal selected from, for example, aluminum, zinc, manganese, zirconium, and rare earth elements. The content of the metal species other than magnesium in the magnesium alloy is, for example, from 0.3 mass % or more to 10 mass % or less. Examples of the magnesium alloy include AZ10, 31, 61, 63, 80, 81, 91, and 92 described in Japanese Industrial Standards (JIS) H4201: 2011, H4203:2011, and H4204:2011.

The iron alloy (for example, a stainless steel) has iron as a main component and further contains, as another metal species different from the main component metal species, at least one metal selected from, for example, chromium, nickel, molybdenum, and manganese. The content of the metal species other than iron in the iron alloy is, for example, 10 mass % or more to 50 mass % or less. Examples of the stainless steel include SUS201, 303, 303Se, 304, 304L, 304NI, 305, 305JI, 309S, 310S, 316, 316L, 321, 347, 384, XM7, 303F, 303C, 430, 430F, 434, 410, 416, 420J1, 420J2, 420F, 420C, and 631J1 as the codes of species described in Japanese Industrial Standards (JIS) G4303: 2005.

The nickel alloy has nickel as a main component and further contains, as another metal species different from the main component metal species, at least one metal selected from, for example, iron, chromium, molybdenum, and cobalt. The content of the metal species other than nickel in the nickel alloy is, for example, from 20 mass % or more to 75 mass % or less. Examples of the nickel alloy include NCF600, 601, 625, 750, 800, 800H, and 825 and NW0276, 4400, 6002, and 6022 in the alloy number described in Japanese Industrial Standards (JIS) H4551:2000.

The copper alloy has copper as a main component and further contains, as another metal species different from the main component metal species, at least one metal selected from, for example, iron, lead, zinc, and tin. The content of the metal species other than copper in the copper alloy is, for example from 3 mass % or more to 50 mass % or less. Examples of the copper alloy include C2100, 2200, 2300, 2400, 2600, 2680, 2720, 2801, 3560, 3561, 3710, 3713, 4250, 4430, 4621, 4640, 6140, 6161, 6280, 6301, 7060, 7150, 1401, 2051, 6711, and 6712 in the alloy number described in Japanese Industrial Standards (JIS) H3100: 2006.

1-2. Metal Oxide

The abrasive and polishing composition according to the present embodiment can be used for polishing the polishing objects containing a metal oxide. The metal oxide is an oxide of a metal or a metalloid, or a complex oxide of them. Examples include oxides of at least one metal or metalloid selected from the elements in Group III, IV, and XIII of the periodic table and complex oxides of them. Specific examples include silicon oxide (silica), aluminum oxide (alumina), titanium oxide (titania), zirconium oxide (zirconia), gallium oxide, yttrium oxide (yttria), and germanium oxide and complex oxides of them. Of these metal oxides, silicon oxide, aluminum oxide (such as corundum), zirconium oxide, and yttrium oxide are particularly preferred.

The metal oxide contained by the polishing objects may be a mixture of a plurality of the metal oxides or metalloid oxides, a mixture of a plurality of the complex oxides, or a mixture of the metal or metalloid oxide and the complex oxide. Alternatively, the metal oxide contained by the polishing objects may be a complex material between the metal or metalloid oxide or the complex oxide and a material of another kind (for example, a metal, carbon, or ceramics).

The metal oxide to be contained by the polishing objects may be in the form of single crystal, polycrystal, sintered body (ceramics), or the like. When the metal oxide is in such a form, the polishing objects can be composed entirely of the metal oxide. The metal oxide to be contained by the polishing objects may be in the form of an anodized film formed by anodizing a pure metal or an alloy. This means that the metal oxide to be contained by the polishing objects may be, like the anodized film of a pure metal or an alloy, an oxide formed on the surface of the metal by oxidizing the metal itself.

When the metal oxide takes such a form, a portion of the polishing objects may be composed of the metal oxide and the other portion may be composed of another material. When the metal oxide film is the form of an anodized film, a portion of the polishing objects including their surface is composed of the metal oxide and the other portion is made of a pure metal or an alloy.

Examples of the anodized film include a film composed of aluminum oxide, titanium oxide, magnesium oxide, or zirconium oxide.

The polishing objects may be obtained by forming a film on the surface of a base material made of a material (for example, a metal, carbon, or ceramics) different in kind from the metal oxide by film forming treatment such as spraying (for example, plasma spraying or frame spraying), plating, chemical vapor deposition (CVD), or physical vapor deposition (PVD).

Examples of the film formed by spraying include metal oxide films composed of aluminum oxide, zirconium oxide, or yttrium oxide.

Examples of the film formed by plating include metal films composed of zinc, nickel, chromium, tin, or copper, or an alloy of such a metal.

Examples of the film formed by chemical vapor deposition include ceramic films composed of silicon oxide, aluminum oxide, or silicon nitride.

Examples of the film formed by physical vapor deposition include metal films composed of copper, chromium, titanium, a copper alloy, a nickel alloy, or an iron alloy.

2. Abrasive

The abrasive according to the present embodiment contains alumina. Alumina is present in various crystal forms and is present, for example, as α-alumina, μ-alumina, γ-alumina, θ-alumina, or the like. Alumina may also be present in the form of an aluminum compound called "hydrated alumina". From the standpoint of a polishing removal rate, it is preferred to use a particle composed mainly of α-alumina as an abrasive (abrasive grains) and polish the polishing objects with a polishing composition containing this abrasive.

The α-conversion rate of alumina may be 70% or more, preferably 80% or more, more preferably 90% or more. The α-conversion rate of alumina can be determined from an integrated intensity ratio of the plane (113) diffraction line by X-ray diffraction measurement.

The alumina may preferably have a BET specific surface area of 5 $m^2/g$ or more to 50 $m^2/g$ or less, preferably 15 $m^2/g$ or more to 25 $m^2/g$ or less. When the BET specific surface area is smaller than the above range, there is a fear that undulation cannot be removed and a smooth surface cannot be obtained. When it is greater, on the other hand, there is a fear that an adequate polishing removal rate cannot be achieved. The BET specific surface area of alumina can be measured using "Flow Sorb II 2300", product of Micromeritics. Examples of a gas caused to adsorb to alumina at the time of measurement of the specific surface area include nitrogen, argon, and krypton.

Further, a 50% particle diameter of the alumina in volume-based cumulative particle diameter distribution (which may hereinafter be called "D50"), that is, an average secondary particle diameter is 0.15 μm or more to 0.35 μm or less, preferably 0.16 μm or more to 0.31 μm or less, more preferably 0.25 μm or more to 0.29 μm or less, still more preferably 0.26 μm or more to 0.27 μm or less.

A 10% particle diameter of the alumina in the volume-based cumulative particle diameter distribution (which hereinafter be called "D10") is less than the 50% particle diameter and 0.10 μm or more to 0.25 μm or less, preferably less than the 50% particle diameter and 0.13 μm or more to 0.23 μm or less, more preferably less than the 50% particle diameter and 0.18 μm or more to 0.20 μm or less, still more preferably less than the 50% particle diameter and 0.19 μm or more to 0.20 μm or less.

Further, a 90% particle diameter of the alumina in the volume-based cumulative particle diameter distribution (which may hereinafter be called "D90") is more than the 50% particle diameter and 0.18 μm or more to 0.45 μm or less, preferably more than the 50% particle diameter and 0.20 μm or more to 0.42 μm or less, more preferably more than the 50% particle diameter and 0.35 μm or more to 0.39 μm or less, still more preferably more than the 50% particle diameter and 0.36 μm or more to 0.37 μm or less.

When the particle diameter of the alumina is smaller than the above range, there is a fear that a sufficient polishing removal rate cannot be achieved, while when it is larger than the above range, there is a fear that undulation cannot be removed and a smooth surface cannot be obtained.

A ratio of D90 to D50 (D90/D50) may be 1.1 or more to 2.5 or less, preferably 1.1 or more to 1.7 or less, more preferably 1.2 or more to 1.5 or less.

A ratio of D90 to D10 (D90/D10) may be 1.2 or more to 6.5 or less, preferably 1.3 or more to 2.5 or less, more preferably 1.7 or more to 2.1 or less.

A ratio of D50 to D10 (D50/D10) may be 1.1 or more to 2.0 or less, preferably 1.1 or more to 1.8 or less, more preferably 1.2 or more to 1.6 or less.

When these ratios are smaller than the above ranges, respectively, a production cost of the alumina may become expensive, while when they are greater, there is a fear that the polishing objects may have scratches on their surface.

It is to be noted that D10, D50, and D90 are particle diameters at which in a volume-based cumulative particle diameter distribution, the frequencies integrated from the side of a small particle diameter are 10%, 50%, and 90%, respectively. These D10, D50, and D90 can be measured using a laser diffraction/scattering particle diameter distribution analyzer (for example, "LA-950", product of Horiba, Ltd.).

The content of the abrasive in the polishing composition of the present embodiment may be 0.5 mass % or more to 40 mass % or less, preferably 1 mass % or more to 20 mass % or less. When the content of the abrasive is smaller than the above range, there is a fear that an adequate polishing removal rate cannot be achieved, while when it is larger than the above range, there is a fear that the polishing composition becomes too expensive.

3. Polishing Composition

The polishing composition of the present embodiment contains the abrasive of the present embodiment and has a pH of 7 or less. The polishing composition of the present embodiment may contain, in addition to the abrasive, a liquid medium or additive as desired.

3-1. Liquid Medium

The polishing composition of the present embodiment may be slurry, containing a liquid medium as a dispersing medium or solvent for dispersing the abrasive and dispersing or dissolving another component. As the liquid medium, water is preferred. From the standpoint of suppressing it from hindering the action of another component, water containing an impurity as less as possible is preferred. More specifically, pure water obtained by removing an impurity ion by using an ion exchanged resin and then filtering off a contaminant, ultrapure water, or distilled water is preferred.

3-2. pH and pH Adjustment Agent

The polishing composition of the present embodiment has a pH of 7.0 or less, preferably 4.0 or less. The polishing composition of the present embodiment has a pH of preferably 2.0 or more. When the pH falls within the above ranges, the resulting polishing composition is excellent in polishing removal rate. The polishing composition having a pH within the above ranges can be treated safely because it has high safety.

The pH adjustment of the polishing composition of the present embodiment may be performed with a pH adjustment agent as an additive. The pH adjustment agent can adjust the pH of the polishing composition and control the polishing removal rate of the polishing objects, the dispersibility of the abrasive, or the like. The pH adjustment agent may be used either singly or as a mixture of two or more.

As the pH adjustment agent, known acids and bases and salts of them can be used. Specific examples of the acids usable as the pH adjustment agent include inorganic acids such as hydrochloric acid, sulfuric acid, nitric acid, hydrofluoric acid, boric acid, carbonic acid, hypophosphorous acid, phosphorous acid, and phosphoric acid; and organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, and phenoxyacetic acid.

When the inorganic acid is used as the pH adjustment agent, sulfuric acid, nitric acid, hydrochloric acid, phosphoric acid, and the like are preferred from the standpoint of improving the polishing removal rate and when the organic acid is used as the pH adjustment agent, glycolic acid, succinic acid, maleic acid, citric acid, tartaric acid, malic acid, gluconic acid, itaconic acid, and the like are preferred.

Examples of the bases usable as the pH adjustment agent include amines such as aliphatic amines and aromatic amines, organic bases such as quaternary ammonium hydroxides, hydroxides of an alkali metal such as potassium hydroxide, hydroxides of an alkaline earth metal, and ammonia. Of these bases, potassium hydroxide and ammonia are preferred from easy availability.

Salts such as ammonium salts or alkali metal salts of the above acids may be used as the pH adjustment agent instead of the above acids or in combination with the above acids. In particular, a salt between a weak acid and a strong base, a salt between a strong acid and a weak base, or a salt between a weak acid and a weak base is expected to have a pH buffer action and a salt between a strong acid and a strong base can adjust not only pH but also electroconductivity even if its addition amount is small.

The addition amount of the pH adjustment agent is not particularly limited and it may be adjusted as needed to obtain a polishing composition having a desired pH.

3-3. Other Additives

The polishing composition of the present embodiment may further contain an additive other than the pH adjustment agent as needed in order to have improved performance. The polishing composition may contain, for example, an additive effective for increasing the polishing removal rate such as complexing agent, etching agent, or oxidant. The polishing composition may contain a water-soluble polymer (it may be a copolymer or a salt or derivative of it) acting the surface of the polishing objects or the surface of the abrasive. The polishing composition may still further contain an additive such as a dispersant for improving the dispersibility of the abrasive or a dispersing agent facilitating re-dispersion of an aggregate of the abrasive. The polishing composition may still further contain a known additive such as antiseptic agent, mildew proofing agent, or rust inhibitive.

These various additives have already been known in many PTLs as can ordinarily be incorporated in polishing compositions and no particular limitation is imposed on their kind or addition amount. When these additives are added, however, an addition amount of each of them is preferably less than 1 mass %, more preferably less than 0.5 mass % based on the total amount of the polishing composition. These additives may be used either singly or in combination of two or more.

Examples of the complexing agent include inorganic acids, organic acids, amino acids, nitrile compounds, and chelating agents. Specific examples of the inorganic acids include sulfuric acid, nitric acid, boric acid, and carbonic acid. Specific examples of the organic acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimeric acid, maleic acid, phthalic acid, malic acid, tartaric acid, citric acid, and lactic acid. Organic sulfuric acids such as methanesulfonic acid, ethanesulfonic acid, and isethionic acid are also usable. Instead of the inorganic acid or organic acid or in combination with the inorganic acid or organic acid, salts such as alkali metal salts of the inorganic acid or organic acid may be used. Of these complexing agents, glycine, alanine, malic acid, tartaric acid, citric acid, glycolic acid, and isethionic acid, and salts of them are preferred.

Examples of the chelating agent include carboxylic acid-based chelating agents such as gluconic acid, amine-based chelating agents such as ethylenediamine, diethylenetriamine, and trimethyltetramine; and polyaminopolycarboxylic acid-based chelating agents such as ethylenediaminetetraacetic acid, nitrilotriacetic acid, hydroxyethylethylenediaminetriacetic acid, triethylenetraminehexaacetic acid, and diethylenetriaminepentaacetic acid. Additional examples of the chelating agent include organic phosphonic acid-based chelating agents such as 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, methanehydroxyphosphonic acid, and 1-phosphonobutane-2,3,4-tricarboxylic acid, phenol derivatives, and 1,3-diketones.

Examples of the etching agent include inorganic acids such as nitric acid, sulfuric acid, hydrochloric acid, phosphoric acid, and hydrofluoric acid; organic acids such as acetic acid, citric acid, tartaric acid, and methanesulfonic acid; inorganic alkalis such as potassium hydroxide, sodium hydroxide, and ammonia, and organic alkalis such as amines and quaternary ammonium hydroxides.

Examples of the oxidant include hydrogen peroxide, peracetic acid, percarbonate salts, urea peroxide, perchlorate salts, persulfate salts, nitric acid, and potassium permanganate.

Examples of the water-soluble polymer (it may be a copolymer or a salt or derivative of it) include polycarboxylic acids such as polyacrylate salts, polyphosphonic acid, polysulfonic acids such as polystyrene sulfonic acid, polysaccharides such as xanthan gum and sodium alginate, and cellulose derivatives such as hydroxyethyl cellulose and carboxymethyl cellulose. Examples of the water-soluble polymer also include polyethylene glycol, polyvinyl alcohol, polyvinylpyrrolidone, sorbitan monooleate, and oxyalkylene-based polymers having one or more oxyalkylene units.

Examples of the dispersing agent include condensed phosphate salts such as pyrophosphate salts and hexametaphosphate salts. Examples of the antiseptic include sodium hypochlorite. Examples of the mildew proofing agent include oxazolines such as oxazolidine-2,5-dione.

Examples of an anticorrosive include surfactants, alcohols, polymers, resins, amines, pyridines, tetraphenylphosphonium salts, benzotriazoles, triazoles, tetrazoles, and benzoic acid.

Examples of the surfactants include nonionic surfactants, anionic surfactants, cationic surfactants, and amphoteric surfactants. Examples of the nonionic surfactants include ether species, ether ester species, ester species, and nitrogen-containing species surfactants. Examples of the anionic surfactants include carboxylate salts, sulfonate salts, sulfate ester salts, and phosphate ester salts. Examples of the cationic surfactants include aliphatic amine salts, aliphatic quaternary ammonium salts, benzalkonium chloride salt, benzethonium chloride salts, pyridinium salts, and imidazolinium salts. Examples of the amphoteric surfactants include carboxybetaine type, aminocarboxylate salts, imidazolinium betaine, lecithin, and alkylamine oxides.

Examples of the antiseptic include sodium hypochlorite. Examples of the mildew proofing agent include oxazolines such as oxazolidine-2,5-dione.

4. Method of Producing Polishing Composition

A method of producing the polishing composition of the present embodiment is not particularly limited and the polishing composition can be produced by stirring and mixing alumina and, if desired, various additives in a liquid solvent such as water. For example, it can be produced by stirring and mixing, in water, alumina and various additives such as pH adjustment agent. The temperature at the time of mixing these components is not particularly limited. It is preferably 10° C. or more to 40° C. or less and a dissolving rate may be improved by heating. A mixing time is also not particularly limited.

The polishing composition of the present embodiment may be a single agent type or a multi-agent type comprised of two or more agents. When the polishing objects are polished using a polishing apparatus having a plurality of supply routes for the polishing composition, polishing may be performed as follows. Described specifically, polishing may be performed by preparing a plurality of raw material compositions to be used as a raw material for a polishing composition in advance, supplying the plurality of raw material compositions to a polishing apparatus through a supply route, and mixing the plurality of raw material compositions in the polishing apparatus to form a polishing composition.

The polishing composition of the present embodiment may be prepared by diluting a stock solution of the polishing composition with water. When the polishing composition is a two-agent type, mixing and dilution of two raw material compositions serving as the raw materials for the polishing composition may be performed in any order. For example, after dilution of one of the raw material compositions with water, the diluted composition may be mixed with the other raw material composition, mixing of the two raw material compositions and dilution with water may be performed simultaneously, or after mixing of the two raw material compositions, the resulting mixture may be diluted with water.

5. Polishing Apparatus and Polishing Method

The polishing composition of the present embodiment can be used in a polishing apparatus and under polishing conditions typically used in polishing of polishing objects made of, for example, crystals of a metal oxide. As the polishing apparatus, a general single-side polishing apparatus or double-side polishing apparatus is usable. When polishing is performed using the single-side polishing apparatus, one of the sides of a polishing object is polished by holding a polishing object by means of a holding tool called "carrier", pressing a platen attached with a polishing pad against the one side of the object to be polished while supplying it with the polishing composition, and rotating the platen. When polishing is performed using the double-side polishing apparatus, both sides of a polishing object is polished by holding the object to be polished by means of a carrier, pressing a platen attached with a polishing pad against the both sides of the object to be polished while supplying it with the polishing composition, and rotating the polishing pad and the object to be polished in directions opposite to each other, respectively. By either of the polishing apparatuses, a polishing object is polished by the physical action caused by friction between the polishing pad and polishing composition and the object to be polished and chemical action of the polishing composition on the object to be polished.

Of the polishing conditions, a polishing pressure (pressure applied to a polishing object during polishing) is not particularly limited. In general, however, the greater the polishing pressure, the higher the friction force between the abrasive and the object to be polished. This leads to improvement in mechanical processing properties and an increase in polishing removal rate. The polishing pressure is preferably 2 kPa (20 gf/cm$^2$) or more to 98 kPa (1000 gf/cm$^2$) or less, more preferably 3 kPa (30 gf/cm$^2$) or more to 78 kPa (800 gf/cm$^2$) or less, still more preferably 3 kPa (30 gf/cm$^2$) or more to 59 kPa (600 gf/cm$^2$) or less. When the polishing pressure falls within the above-described ranges, a sufficiently high polishing removal rate can be attained and in addition, occurrence of breakage of the object to be polished or surface defects can be reduced.

Under the polishing conditions, a linear velocity (relative velocity between the polishing pad and the object to be polished during polishing) is generally affected by the rotational speed of the polishing pad, the rotational speed of the carrier, the size of the object to be polished, the number of the object to be polished, and the like. When the linear velocity is large, due to an increase in the contact frequency of the abrasive with the object to be polished, frictional force acting between the object to be polished and the abrasive becomes large and the mechanical polishing action on the object to be polished becomes large. Heat generated by the friction sometimes enhances the chemical polishing action of the polishing composition.

Although the linear velocity is not particularly limited, it is preferably 10 m/min or more to 300 m/min or less, more preferably 30 m/min or more to 250 m/min or less. When the linear velocity falls within the above-described ranges, a sufficiently high polishing removal rate can be attained and at the same time, adequate frictional force can be given to the object to be polished. On the other hand, friction generated directly between the polishing pad and the object to be polished is preferably as small as possible because it does not contribute to polishing.

Of the polishing conditions, a supply flow rate of the polishing composition depends on the kind of the object to be polished, the kind of the polishing apparatus, or another polishing condition, but it is preferably a supply flow rate sufficient for uniformly supplying the polishing composition to the entirety of the object to be polished and the polishing pad.

The kind of the polishing pad is not particularly limited and various polishing pads different in material, thickness, or physical properties such as hardness can be used. For example, polishing pads of various materials such as polyurethane type, nonwoven fabric type, or suede type can be used. As the polishing pad, either an abrasive-containing polishing pad or an abrasive-free polishing pad can be used.

Moreover, the polishing composition of the present embodiment collected after it is used for polishing of the object to be polished can be reused for polishing of another object to be polished. One example of a method of reusing the polishing composition include a method of collecting, in a tank, the polishing composition discharged after use from the polishing apparatus, circulating the composition from the tank to the polishing apparatus, and using the resulting polishing composition for polishing. Using of the polishing composition in recycle is useful for reducing the amount of the polishing composition discharged as a waste liquid and therefore, reducing an environmental burden. In addition, it contributes to a reduction in a using amount of the polishing composition and therefore a manufacturing cost required for polishing polishing objects can be reduced.

For reusing the polishing composition of the present embodiment, it is recommended to reuse after addition, as a composition adjustment agent, of a portion or whole of the abrasive, additive, and the like consumed or lost during use for polishing. A mixture obtained by mixing the abrasive, additive, and the like at an arbitrary mixing ratio may be used as the composition adjustment agent or the abrasive, additive, and the like may be used as the composition adjustment agent as is. By adding the composition adjustment agent further, the polishing composition is adjusted to have a composition suited for re-use so that preferable polishing can be performed with the resulting polishing composition. The concentration of the abrasive and additive to be incorporated in the composition adjustment agent is arbitrary and is not limited particularly. The concentration may be adjusted as needed depending on the size of the tank or polishing condition.

EXAMPLES

The present invention will hereinafter be described more specifically by Examples and Comparative Examples shown below.

First, alumina particles, a pH adjustment agent (citric acid), a water-soluble polymer (sodium polyacrylate), and pure water were mixed to prepare 13 types of polishing compositions. The content of the components in each of the polishing compositions is as listed in Table 1. The balance is water. As the alumina particles, any of seven types of alumina particles different in properties ($\alpha$-conversion rate, D10, D50, D90, and specific surface area) was used. The $\alpha$-conversion rate, D10, D50, D90, and specific surface area of the alumina particles are as listed in Table 1. The pH of each of the polishing compositions is as listed in Table 1.

TABLE 1

| | | Composition of polishing composition | | | | Properties of alumina | | | | | | | |
|---|---|---|---|---|---|---|---|---|---|---|---|---|---|
| | Polishing object | Alumina (mass %) | pH adjustment agent (mass %) | Water-soluble polymer (mass %) | pH of polishing composition | $\alpha$-conversion rate (%) | D10 ($\mu$m) | D50 ($\mu$m) | D90 ($\mu$m) | Specific surface area (m²/g) | Polishing removal rate ($\mu$m/min) | Rz (nm) | Haze |
| Ex. 1 | Aluminum alloy | 5 | 1 | — | 2.5 | 93 | 0.20 | 0.27 | 0.37 | 17 | 0.08 | 495 | None |
| Ex. 2 | Anodized film | 2 | 1 | 0.5 | 2.5 | 93 | 0.20 | 0.27 | 0.37 | 17 | 0.41 | 227 | None |
| Ex. 3 | SUS304 | 9 | 1 | 0.5 | 3.1 | 93 | 0.20 | 0.27 | 0.37 | 17 | 0.23 | 350 | None |
| Ex. 4 | SUS316L | 5 | 3 | 0.5 | 2.5 | 93 | 0.20 | 0.27 | 0.37 | 17 | 0.19 | 475 | None |
| Ex. 5 | Anodized film | 2 | 1 | 0.5 | 8.0 | 93 | 0.20 | 0.27 | 0.37 | 17 | 0.32 | — | — |
| Comp. Ex. 1 | Anodized film | 2 | 3 | 0.5 | 2.1 | 76 | 0.23 | 0.35 | 0.56 | 10 | 0.62 | 327 | Present |
| Comp. Ex. 2 | Anodized film | 10 | 3 | 0.5 | 2.1 | 99 or more | 2.7 | 4.8 | 7.4 | 1.7 | 0.79 | 376 | Present |
| Comp. Ex. 3 | SUS304 | 9 | 1 | 0.5 | 3.1 | 76 | 0.23 | 0.35 | 0.56 | 10 | 0.36 | 1315 | Present |
| Comp. Ex. 4 | SUS304 | 18 | 0.8 | 0.4 | 3.0 | 99 or more | 2.7 | 4.8 | 7.4 | 1.7 | 0.48 | 1650 | Present |
| Comp. Ex. 5 | SUS316L | 5 | 3 | 0.5 | 2.5 | 76 | 0.19 | 0.23 | 0.33 | 17 | 0.36 | 1004 | None |
| Comp. Ex. 6 | SUS316L | 5 | 3 | 0.5 | 2.5 | 20 or less | 0.13 | 0.16 | 0.19 | 18 | 0.18 | 1191 | Present |
| Comp. Ex. 7 | SUS316L | 5 | 3 | 0.5 | 2.5 | 25 | 0.18 | 0.25 | 0.33 | 19 | 0.21 | 1004 | Present |
| Comp. Ex. 8 | SUS316L | 5 | 3 | 0.5 | 2.5 | 99 or more | 0.12 | 0.14 | 0.19 | 19 | 0.08 | 1139 | Present |

The $\alpha$-conversion rate of the alumina particles was calculated from an integrated intensity ratio of (113) plane diffraction line measured using an X-ray diffraction apparatus "Ultima IV", product of Rigaku Corporation. The D10, D50, and D90 of the alumina particles were measured using a laser diffraction/scattering particle diameter distribution analyzer "LA-950", product of Horiba, Ltd. The BET surface area of the alumina particles was measured using a specific surface area analyzer "Flow Sorb II 2300", product of Micromeritics.

Next, a polishing object was polished using 13 types of polishing compositions and the polishing removal rate, surface roughness Rz of the polished surface, and the haze of the polished surface were measured. As the object to be polished, any of a substrate (square with sides of 32 mm)

made of a 7000 series aluminum alloy, a substrate (square with sides of 60 mm) made of aluminum and having an anodized film, a substrate (round with a diameter of 25 mm) made of SUS304, and a substrate (square with sides of 45 mm) made of SUS316L was used. The combination of types of the polishing composition and the substrate is as listed in Table 1.

Polishing conditions are as described below.
<Polishing Conditions of Substrate Made of 7000 Series Aluminum Alloy>
  Polishing apparatus: Single-side polishing apparatus (diameter of platen: 380 mm)
  Polishing pad: polishing pad made of polyurethane
  Polishing pressure: 17.1 kPa (175 gf/cm$^2$)
  Rotational speed of platen: 90 min$^{-1}$
  Polishing removal rate (linear velocity): 71.5 m/min
  Polishing time: 15 minutes
  Supply flow rate of polishing composition: 26 mL/min
<Polishing Conditions of Substrate Made of Aluminum and Having Anodized Film>
  Polishing apparatus: Single-side polishing apparatus (diameter of platen: 65 mm)
  Polishing pad: polishing pad made of polyurethane
  Polishing pressure: 3.7 kPa (38 gf/cm$^2$)
  Rotational speed of platen: 1000 min$^{-1}$
  Polishing removal rate (linear velocity): 108 m/min
  Polishing time: 5 minutes
  Supply flow rate of polishing composition: 15 mL/min
<Polishing Conditions of Substrate Made of SUS304>
  Polishing apparatus: Single-side polishing apparatus (diameter of platen: 380 mm)
  Polishing pad: polishing pad made of nonwoven fabric
  Polishing pressure: 16.7 kPa (170 gf/cm$^2$)
  Rotational speed of platen: 90 min$^{-1}$
  Polishing removal rate (linear velocity): 71.5 m/min
  Polishing time: 5 minutes
  Supply flow rate of polishing composition: 17 mL/min
<Polishing Conditions of Substrate Made of SUS316L>
  Polishing apparatus: Single-side polishing apparatus (diameter of the platen: 380 mm)
  Polishing pad: polishing pad made of nonwoven fabric
  Polishing pressure: 27.9 kPa (285 gf/cm$^2$)
  Rotational speed of platen: 72 min$^{-1}$
  Polishing removal rate (linear velocity): 57.3 m/min
  Polishing time: 10 minutes
  Supply flow rate of polishing composition: 35 mL/min The polishing removal rate, surface roughness Rz of a polished surface, and haze of the polished surface are measured by the following methods, respectively. The polishing removal rate was determined from a difference between the masses of the substrate measured before and after polishing.

The surface roughness Rz of a polished surface of the object to be polished was measured as follows: that of the substrate made of a 7000 series aluminum alloy and that of the substrate made of SUS304 were measured using a surface profiler "ZYGO New View 5032", product of Zygo Corporation; that of the substrate made of aluminum and having an anodized film was measured using a probe type surface texture and contour measuring instrument "SURF-COM 1500DX", product of Tokyo Seimitsu; and that of the substrate made of SUS316L was measured using a surface contour measuring machine "VK-X200", product of Keyence.

The haze of the polished surface of the object to be polished was evaluated by visually observing the polished substrate under illumination of a fluorescent lamp and when a portion having turbidity defects was less than 10% of the area of the surface of the substrate, the haze of the substrate was evaluated as "none" and when a portion having turbidity defects was 10% or more of the area of the surface of the substrate, the haze of the substrate is evaluated as "present".

The results are shown in Table 1.

The number of each of the polished substrate made of a 7000 series aluminum alloy, the substrate made of SUS304, and the substrate made of SUS316L was three and an average of the results of each of the polishing removal rate and the surface roughness Rz for the three substrates is listed in Table 1. The number of the polished substrate made of aluminum and having an anodized film was one and the polishing removal rate and the surface roughness Rz of the substrate are listed in Table 1.

As is apparent from the results listed in Table 1, in Examples 1 to 4, the surface of the substrate is polished at a sufficient polishing removal rate and at the same time, the surface roughness Rz and the haze are good. In Example 5 in which the pH is more than 7.0, the surface of the substrate is polished at a sufficient polishing removal rate. In Comparative Examples 1 to 8, the polishing removal rate is sufficient, but one or both of the surface roughness Rz and the haze is poor.

The invention claimed is:

1. An abrasive used for polishing of a polishing object containing at least one of an alloy and a metal oxide, comprising alumina having an α-conversion rate of 80% or more and having a 50% particle diameter, in a volume-based cumulative particle diameter distribution, of 0.15 μm or more to 0.27 μm or less, wherein a ratio of a 90% particle diameter of the alumina in the volume-based cumulative particle diameter distribution (D90) to a 10% particle diameter of the alumina in the volume-based cumulative particle diameter distribution (D10) is 1.7 or more to 2.1 or less.

2. The abrasive according to claim 1, wherein the alumina has a BET specific surface area of 15 m$^2$/g or more to 25 m$^2$/g or less.

3. The abrasive according to claim 2, wherein a 10% particle diameter of the alumina in the volume-based cumulative particle diameter distribution is less than the 50% particle diameter and is 0.10 μm or more to 0.25 μm or less.

4. The abrasive according to claim 2, wherein a 90% particle diameter of the alumina in the volume-based cumulative particle diameter distribution is more than the 50% particle diameter and is 0.20 μm or more to 0.45 μm or less.

5. The abrasive according to claim 1, wherein a 10% particle diameter of the alumina in the volume-based cumulative particle diameter distribution is less than the 50% particle diameter and is 0.10 μm or more to 0.25 μm or less.

6. The abrasive according to claim 5, wherein a 90% particle diameter of the alumina in the volume-based cumulative particle diameter distribution is more than the 50% particle diameter and is 0.20 μm or more to 0.45 μm or less.

7. The abrasive according to claim 1, wherein a 90% particle diameter of the alumina in the volume-based cumulative particle diameter distribution is more than the 50% particle diameter and is 0.20 μm or more to 0.45 μm or less, wherein a ratio of a 90% particle diameter of the alumina in the volume-based cumulative particle diameter distribution (D90) to a 50% particle diameter of the alumina in the volume-based cumulative particle diameter distribution (D50) is 1.2 or more to 1.5 or less.

8. A polishing composition comprising the abrasive as claimed in claim 1 and having a pH of 7 or less.

9. A polishing composition comprising the abrasive as claimed in claim 2 and having a pH of 7 or less.

10. A polishing composition comprising the abrasive as claimed in claim 5 and having a pH of 7 or less.

11. A polishing composition comprising the abrasive as claimed in claim 7 and having a pH of 7 or less.

12. A polishing method comprising polishing a polishing object to be polished containing at least one of an alloy and a metal oxide with the polishing composition as claimed in claim 8.

13. The polishing method according to claim 12, wherein a portion of the object to be polished including the surface of the object has the metal oxide and the other portion has the alloy.

14. The polishing method according to claim 13, wherein the alloy contains at least one of aluminum, titanium, iron, and magnesium.

15. The polishing method according to claim 13, wherein the metal oxide contains at least one of silicon oxide, aluminum oxide, and zirconium oxide.

16. The polishing method according to claim 12, wherein the alloy contains at least one of aluminum, titanium, iron, and magnesium.

17. The polishing method according to claim 12, wherein the metal oxide contains at least one of silicon oxide, aluminum oxide, and zirconium oxide.

* * * * *